United States Patent
Hooper et al.

(10) Patent No.: US 9,510,495 B2
(45) Date of Patent: Nov. 29, 2016

(54) ELECTRONIC DEVICES WITH CAVITY-TYPE, PERMEABLE MATERIAL FILLED PACKAGES, AND METHODS OF THEIR MANUFACTURE

(71) Applicants: Stephen R. Hooper, Mesa, AZ (US);
Darrel R. Frear, Phoenix, AZ (US);
William C. Stermer, Jr., Chandler, AZ (US)

(72) Inventors: Stephen R. Hooper, Mesa, AZ (US);
Darrel R. Frear, Phoenix, AZ (US);
William C. Stermer, Jr., Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 463 days.

(21) Appl. No.: 13/686,102

(22) Filed: Nov. 27, 2012

(65) Prior Publication Data

US 2014/0146509 A1 May 29, 2014

(51) Int. Cl.
| | |
|---|---|
| *H05K 1/03* | (2006.01) |
| *H05K 13/04* | (2006.01) |
| *G01L 19/06* | (2006.01) |
| *B81B 7/00* | (2006.01) |
| *H01L 23/053* | (2006.01) |
| *H01L 23/24* | (2006.01) |
| *H01L 23/498* | (2006.01) |

(52) U.S. Cl.
CPC ......... *H05K 13/0469* (2013.01); *B81B 7/0038* (2013.01); *G01L 19/0654* (2013.01); *H01L 23/053* (2013.01); *H01L 23/24* (2013.01); *H01L 23/49861* (2013.01); *H01L 2224/48091* (2013.01); *H01L 2224/48137* (2013.01); *H01L 2224/48247* (2013.01); *H01L 2924/1461* (2013.01); *Y10T 156/10* (2015.01)

(58) Field of Classification Search
CPC .......... H05K 13/0469; G01L 19/0654; B81B 7/0038; Y10T 156/10; H01L 23/053; H01L 2224/48091
USPC ................ 174/155, 250, 251, 256–258, 260; 361/679.01, 679.02, 748
See application file for complete search history.

(56) References Cited

U.S. PATENT DOCUMENTS

| | | | | |
|---|---|---|---|---|
| 7,749,797 | B2 * | 7/2010 | Bauer | ..................... H01L 24/83 257/433 |
| 2001/0028072 | A1 * | 10/2001 | Aoki | ..................... G01L 19/147 257/254 |

(Continued)

FOREIGN PATENT DOCUMENTS

| | | |
|---|---|---|
| JP | 2001050836 A | 2/2001 |
| JP | 2001116639 A | 4/2001 |
| JP | 2001153746 A | 6/2001 |

OTHER PUBLICATIONS

Machine Translation of Japanese Patent Publication No. 2001-153746, Aoki et al., Jun. 8, 2001.*

*Primary Examiner* — Tremesha S Willis
(74) *Attorney, Agent, or Firm* — Sherry W. Schumm (57) ABSTRACT

Embodiments include devices and methods of their manufacture. A device embodiment includes a package housing, at least one electronic circuit (e.g., a sensor circuit), a first material, and a second material. The package housing includes a cavity that is partially defined by a cavity bottom surface, and the cavity bottom surface includes a mounting area and a non-mounting area. The at least one electronic circuit is attached to the cavity bottom surface over the mounting area. The first material has a relatively high, first modulus of elasticity, and covers the non-mounting area. The second material has a relatively low, second modulus of elasticity, and is disposed over the first material within the cavity.

10 Claims, 5 Drawing Sheets

(56) References Cited

U.S. PATENT DOCUMENTS

| | | |
|---|---|---|
| 2002/0180019 A1 | 12/2002 | Saito et al. |
| 2004/0089922 A1 | 5/2004 | Gerber et al. |
| 2008/0173097 A1 | 7/2008 | Bauer et al. |
| 2012/0306031 A1* | 12/2012 | Lo .................. G01L 19/0627 257/415 |

* cited by examiner

ELECTRONIC DEVICES WITH CAVITY-TYPE, PERMEABLE MATERIAL FILLED PACKAGES, AND METHODS OF THEIR MANUFACTURE

TECHNICAL FIELD

Embodiments of the subject matter described herein relate generally to electronic devices with cavity-type, permeable material (e.g., gel) filled packages, and methods of their manufacture.

BACKGROUND

An electronic device configured as an environmental sensor may include a sensor integrated circuit (IC) housed within the cavity of a cavity-type package. To enable the sensor IC to sense particular characteristics of the environment, the package may include an opening (e.g., in the package lid), which permits exposure of the sensor IC to the external environment. In some types of sensors, such as pressure sensors, a moisture-permeable material (e.g., a gel) may be disposed inside the cavity and over the sensor IC, in order to protect the sensor IC from otherwise potentially destructive exposure to the external environment. In such a device, the quantity of gel disposed within the cavity is selected so that an air gap is present between the surface of the gel and the package lid. During a sensing operation, the force of air pressure impinging upon the exposed surface of the gel is translated through the gel to the pressure sensor IC. The pressure sensor IC acts as a transducer, generating an electrical signal indicative of the pressure imposed.

In some cases, moisture entering the package cavity may result in reliability and/or accuracy issues for such sensor devices. For example, moisture may diffuse through the relatively-permeable, protective gel and lodge on the surface of the package cavity on which the sensor IC is mounted. Under certain conditions (e.g., at elevated temperatures, such as during a reflow process), the moisture may transition to a gaseous state, producing bubbles at the interface between the gel and the package cavity surface. Those bubbles may thereafter migrate to the exposed surface of the gel. When the bubbles are sufficiently large and/or prolific, they may significantly deform the surface of the gel so that the gel contacts the package lid. The bubbles also may migrate to the surface of the sensor IC. Either of these conditions, in turn, may produce a mechanical offset and, thus, inaccuracy in the sensor measurements that may be obtained by the device. In extreme cases, bubble-caused gel surface deformation may substantially eliminate the air gap, and gel may ooze through the package opening, thus compromising the functionality of the sensor device.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments include electronic devices with cavity-type, permeable material filled packages, and methods of their manufacture. Within the cavity of a package housing, at least one electronic circuit (e.g., a pressure sensor IC and an associated control IC) is mounted over a mounting area of the cavity bottom surface using a die attach material. According to an embodiment, a bubble restrictor material (e.g., the die attach material or another material) having a relatively high modulus of elasticity (e.g., a polymer adhesive) is deposited over a remainder of the cavity bottom surface (e.g., the additional material covers a non-mounting area of the bottom surface). The modulus of elasticity of the bubble restrictor material is sufficiently high so that the material functions as a mechanical restrictor of moisture-caused bubble formation at the interface between the cavity bottom surface and the additional material, according to an embodiment.

After deposition of the bubble restrictor material, another material having a relatively low modulus of elasticity (e.g., a gel) is then deposited over the bubble restrictor material. According to an embodiment, the overlying material is permeable to moisture, and a top surface of the overlying material may be exposed to environmental conditions (e.g., to allow the device to sense ambient pressure). Accordingly, moisture may impinge upon and permeate through the overlying material. According to an embodiment, the bubble restrictor material also is permeable to moisture, and thus the moisture also may permeate through the bubble restrictor material, settling on the cavity bottom surface. In an embodiment, and as mentioned above, the bubble restrictor material restricts bubbles from forming at its interface with the cavity bottom surface, particularly at elevated temperatures at which the moisture may undergo a phase change to a gaseous state. Accordingly, in devices having features of the various embodiments, bubbles are not likely to form and migrate to the top, exposed surface of the overlying material, in contrast with conventional devices that lack such a bubble restrictor material. Accordingly, a device implemented in accordance with the various embodiments described herein is less likely to experience deformation of the exposed surface as a result of bubble formation and migration, thus avoiding potential mechanical offsets in the device and/or more serious issues that such bubbles otherwise may cause.

Figure 1:
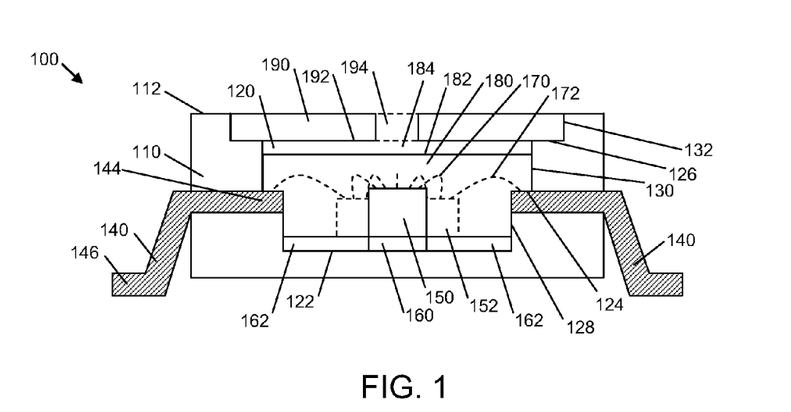
FIG. 1 is a cross-sectional, side view of an electronic device with a cavity-type, permeable material filled package, in accordance with an example embodiment.

FIG. 1 is a cross-sectional, side view of an electronic device 100 with a cavity-type, permeable material filled package, in accordance with an example embodiment. For example, device 100 may be a pressure sensor, an accelerometer, another type of transducer, or another type of device that may benefit from features of the various embodiments (e.g., a device in which bubble formation is not desired).

Device 100 includes a package housing 110 with a cavity 120 formed in a top surface 112 of the package housing 110. According to an embodiment, the cavity 120 is defined by a cavity bottom surface 122, one or more bonding shelves 124, a lid attach surface 126, lower sidewalls 128 extending between the cavity bottom surface 122 and the bonding shelves 124, intermediate sidewalls 130 extending between the bonding shelves 124 and the lid attach surface 126, and upper sidewalls 132 extending between the lid attach surface 126 and the package top surface 112. The package housing 110 may comprise a rigid and relatively porous material (e.g., a cured mold compound), and accordingly the various surfaces 122, 124, 126, 128, 130, 132 defining cavity 120 may include small imperfections. As will be discussed in more detail later, such imperfections may allow moisture to be trapped at the interface between certain ones of the surfaces 122, 124, 128, 130 and material overlying those surfaces. However, implementation of the various embodiments may ensure that such moisture does not adversely affect the performance of device 100.

A plurality of conductive structures 140 (referred to as "leads," herein) extending through the package housing 110 provide for transmission of electrical signals and/or voltage references (e.g., power and ground) between electrical devices 150, 152 within the cavity 120 and an exterior of the package housing 110. For example, each of leads 140 includes a first portion 144 and a second portion 146, which are electrically coupled. Each first portion 144 is accessible within the cavity 120, and each second portion 146 is exposed to an exterior of the package housing 110, allowing for physical and electrical connection of the device 100 to a printed circuit board (not illustrated) and/or other substrate included in a larger electrical system. The first portions 144 of the leads 140 are exposed at the bonding shelves 124 within the cavity 120, thus providing a bonding area (e.g., for connection of bondwires) located between the cavity bottom surface 122 and the top surface 112 of the package housing 110.

Within the cavity 120, one or more electronic circuits 150, 152 (e.g., ICs) are mounted over a mounting area of the cavity bottom surface 122 using a die attach material 160. As used herein, the "mounting area" of a cavity bottom surface is defined as the combined area(s) on the cavity bottom surface over which the device's electronic circuit(s) are mounted. The mounting area may include a single area (e.g., over which a single electronic circuit is mounted) or multiple, abutting or spatially separated areas (e.g., over which multiple electronic circuits are mounted). In other words, the "mounting area" of a cavity bottom surface is defined as the footprint of all electronic circuits mounted over the cavity bottom surface. In contrast, the "non-mounting area" of a cavity bottom surface is defined as an entire remainder of the cavity bottom surface, or all portions of the cavity bottom surface over which electronic circuits are not mounted.

According to an embodiment, electronic circuit 150 comprises a sensor circuit (e.g., a pressure sensor IC, an accelerometer IC, or another type of transducer) configured to produce sensor signals indicating a sensed characteristic of an external environment. According to a further embodiment, electronic circuit 152 comprises a control circuit (e.g., illustrated with dashed lines, as electronic circuit 152 is behind the plane of the cross-section of FIG. 1) configured to provide control signals to the sensor circuit, receive sensor signals from the sensor circuit, and send signals representative of the sensor signals to external circuitry (not illustrated).

For example, the sensor circuit may be implemented as a micro-electromechanical system (MEMS) device, although the sensor circuit may be implemented using other technologies, as well. In embodiments in which electronic circuit 150 comprises a pressure sensor IC, for example, the electronic circuit 150 is configured to produce an electrical signal having characteristics that indicate the magnitude of pressure applied to the electronic circuit 150 (e.g., the signal indicates a capacitive, resistive or other change in the electronic circuit 150 due to a change in pressure applied to the electronic circuit 150). For example, such a pressure sensor IC may be implemented as a Wheatstone bridge-type sensor, a piezoresistive transducer (PRT) or piezoresistive strain gauge (e.g., a plurality of strain gauges interconnected to form a Wheatstone bridge), a capacitive sensor (e.g., including a diaphragm and a pressure cavity, which form a variable capacitor), an electromagnetic sensor (e.g., a device configured to measure displacement of a diaphragm by means of changes in inductance), a piezoelectric sensor (e.g., a device that exploits the piezoelectric effect in a material to measure strain), an optical sensor (e.g., a device that senses pressure based on physical change of an optical fiber), and so on. When the device 100 also includes a control IC as a second electronic circuit 152, the control IC may be configured to receive signals from external circuitry (e.g., through leads 140), including control signals and voltage reference signals (e.g., power and ground), provide control signals to the sensor circuit (e.g., input voltages), receive signals from the sensor circuit indicating electrically-sensed environmental conditions, condition, filter or otherwise process the sensor circuit signals, and send signals indicating the processed signals to the external circuitry.

Figure 6:
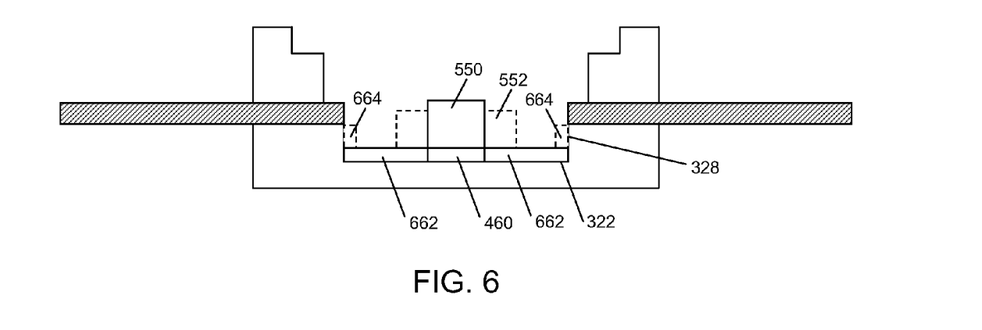
Figure 7:
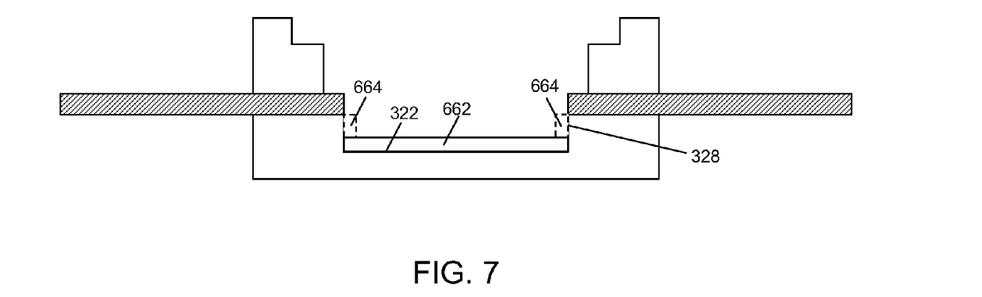

As described previously, the one or more electronic devices 150, 152 are mounted to the mounting area of the cavity bottom surface 122 using a die attach material 160. In addition, according to an embodiment, additional material 162 covers all or substantially all of the non-mounting area of the cavity bottom surface 122. According to another embodiment (e.g., as discussed in conjunction with FIGS. 6 and 7), the additional material 162 also may extend partially or completely up the lower sidewalls 128 of the cavity 120.

The additional material 162 has a relatively high modulus of elasticity, when compared with the modulus of elasticity of an overlying material 180 (discussed later) deposited over the additional material 162 within the cavity 120. As mentioned previously, and according to an embodiment, the modulus of elasticity of the additional material 162 is sufficiently high so that the material 162 functions as a mechanical restrictor of the formation of moisture-caused bubbles at the interface between the cavity bottom surface 122 (and lower sidewalls 128, in a further embodiment). Accordingly, the additional material 162 is also referred to herein as a "bubble restrictor material" and/or a "mechanical restrictor of bubble formation."

The die attach material 160 and the bubble restrictor material 162 may be the same material, in an embodiment, or they may be different materials, in another embodiment. When the die attach material 160 and the bubble restrictor material 162 are the same material, they may be applied to the cavity bottom surface 122 during a single processing step (e.g., a single material deposition process in which a layer of the material 160, 162 is deposited on the cavity bottom surface 122). Alternatively, regardless of whether the die attach material 160 and the bubble restrictor material 162 are the same or different materials, in other embodiments, the die attach material 160 and the bubble restrictor material 162 may be applied to the cavity bottom surface 122 during separate processing steps, as will be explained in more detail later.

The die attach material 160 and the bubble restrictor material 162 may include one or more polymer adhesives, for example, although other materials having sufficient die attach and bubble restriction properties may be used, as well. According to an embodiment, the bubble restrictor material 162 may be permeable to moisture, and accordingly the bubble restrictor material 162 may allow moisture to pass through it and settle on the cavity bottom surface 122, under certain circumstances.

The thickness 164 of the die attach material 160 and the bubble restrictor material 162 may be in a range of about 10 to about 75 microns, for example, although either or both materials 160, 162 may be thinner or thicker, as well. According to an embodiment, the die attach material 160 and the bubble restrictor material 162 have substantially the same thickness, so that the bubble restrictor material 162 does not extend up the sides of the electronic circuits 150, 152 to any significant extent. Alternatively, the bubble restrictor material 162 may extend partially up the sides of the electronic circuits 150, 152.

A plurality of conductive connectors 170, 172 are connected between the electronic circuit 150, 152 and the first portions 144 of the leads 140. For example, connectors 170 may include bondwires connected between the electronic circuits 150, 152 (e.g., between a sensor circuit and a control IC), and connectors 172 may include bondwires connected between one or more of the electronic circuits 150, 152 and the leads 140 (e.g., between the control IC and the device's leads 140 at the bonding area).

An overlying material 180 is deposited over the bubble restrictor material 162. The overlying material may completely cover the bubble restrictor material 162, in an embodiment, and may also completely encompass the electronic circuits 150, 152 and the connectors 170, 172. According to an embodiment, the overlying material 180 has a top surface 182 positioned below the lid attach surface 126, so that an air gap 184 is present between the overlying material 180 and a lid 190 that is subsequently attached to the package housing 110.

According to an embodiment, the overlying material 180 (e.g., an elastomer gel or other material) has a relatively low modulus of elasticity, when compared with the modulus of elasticity of the bubble restrictor material 162. More particularly, the modulus of elasticity of the overlying material 180 may be sufficiently low that the overlying material 180 is not particularly restrictive of bubble formation due to moisture that may be present within the overlying material 180. However, as indicated previously, both the overlying material 180 and the bubble restrictor material 162 include moisture-permeable materials. Accordingly, moisture impinging upon the surface 182 of the overlying material 180 will permeate through both the overlying material 180 and the bubble restrictor material 162, settling on the cavity bottom surface 122. However, even at temperatures at which such moisture may transition to a gaseous state, the bubble restrictor material 162 restricts bubbles from forming at its interface with the cavity bottom surface 122. Accordingly, in device 100, bubbles are not likely to form and migrate to the top surface 182 of the overlying material 182, in contrast with conventional devices that lack the bubble restrictor material 162.

A lid 190 is attached to the lid attach surface 126. For example, the lid 190 may be seated on the lid attach surface 126, which may extend around an entire perimeter of the cavity 120 below the top surface 112 of the package housing 110. In another embodiment, device 100 may not include a distinct lid attach surface 126, and the package housing 110 may instead may accommodate attachment of a lid to the package top surface 112 (i.e., the package top surface 112 functions as the lid attach surface).

The lid 190 includes an opening 194, which allows for exposure of the cavity 120 (or more particularly the top surface 182 of the overlying material 180) to an exterior of the device 100 (i.e., to the external environment). As mentioned previously, an air gap 184 is present between the top surface 182 of the overlying material 180 and a bottom surface 192 of the lid 190. The air gap 184 allows an entirety of the top surface 182 of the overlying material 180 to be exposed to air pressure and/or other environmental characteristics, allowing the electronic circuits 150, 152 to measure the air pressure or other environmental characteristics. By implementing the features of the various embodiments, bubbles that otherwise may affect the accuracy of such measurements are restricted from forming.

Various modifications may be made to device 100, while still facilitating incorporation of the various inventive features. For example, although a cavity 120 having a particular geometrical configuration is depicted in the Figures and described herein, in conjunction with various embodiments, it is to be understood that embodiments of devices may have differently configured cavities, in other embodiments. In addition, although the Figures depict a cavity 120 that is rectangular in shape, when viewed from the top (e.g., as in FIG. 9), other embodiments may include a cavity having a different shape.

Figure 2:
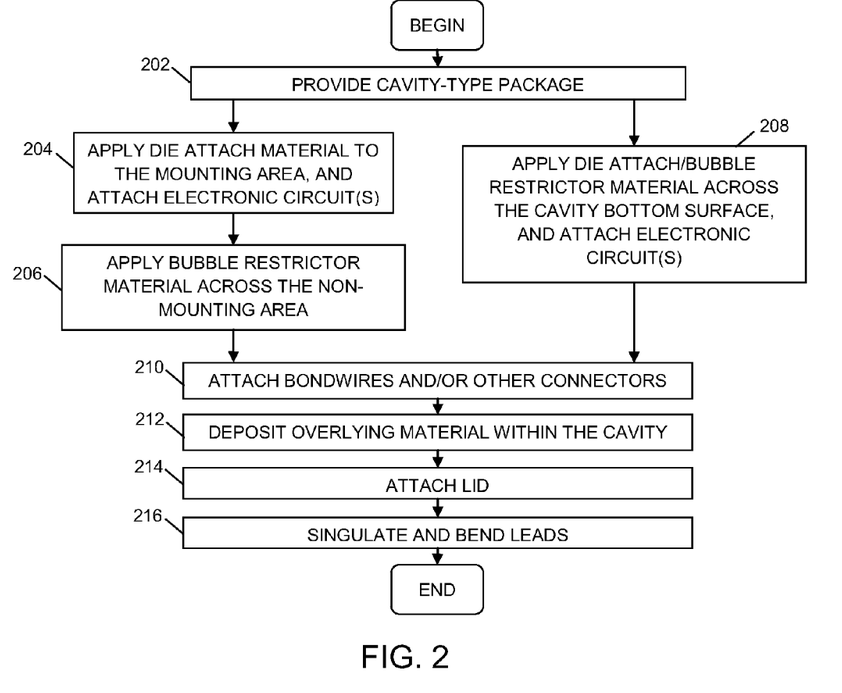
FIG. 2 illustrates a flowchart of a method of manufacturing an electronic device with a cavity-type, permeable material filled package, in accordance with various embodiments.
Figure 3:
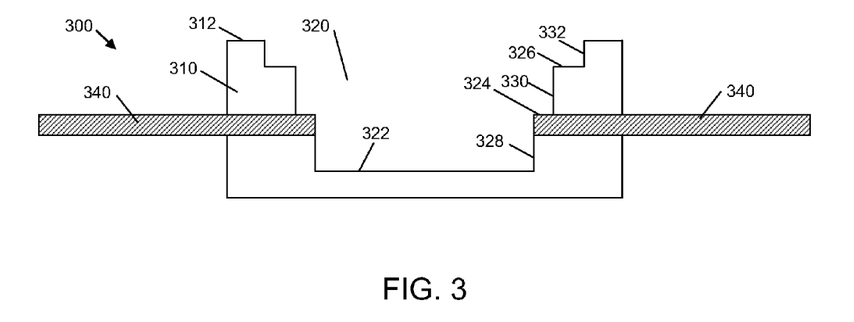
FIGS. 3-13 illustrate various views of an electronic device during the steps of the manufacturing process of FIG. 2, in accordance with various embodiments.
Figure 4:
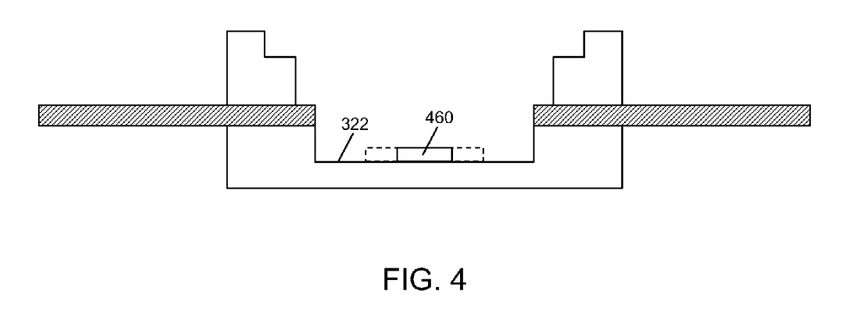

FIG. 2 illustrates a flowchart of a method of manufacturing an electronic device with a cavity-type, permeable material filled package (e.g., device 100, FIG. 1), in accordance with various embodiments. FIG. 2 should be viewed simultaneously with FIGS. 3-13, which illustrate various views of an electronic device during the steps of the manufacturing process of FIG. 2, in accordance with various embodiments.

Although FIGS. 2-13 depict the manufacture of only a single device, multiple instances of such a device may be manufactured in parallel. More specifically, for example, a single device may correspond to one cell within an array of multiple cells of a leadframe, where each cell corresponds to an instance of the device being manufactured, and the multiple devices are manufactured in parallel. Some or all of the devices' leads (e.g., leads 140, FIG. 1) may be coupled via various sacrificial features of the leadframe, and those sacrificial features may be removed during later manufacturing stages (e.g., during a process of singulating the devices). Such a process facilitates parallel manufacturing of multiple electronic devices, and the below described embodiments include both singular and parallel manufacturing processes.

The method may begin, in block 202, by providing a cavity-type package. For example, referring to FIG. 3, a cavity-type package 300 may include a package housing 310 (e.g., package housing 110, FIG. 1) with a cavity 320 and a plurality of leads 340 (e.g., leads 140, FIG. 1). As indicated previously, leads 340 may form portions of one cell of an array of cells of a leadframe, where the cells are interconnected by sacrificial features, not illustrated. The leadframe may then be placed in a mold having a corresponding array of mold pattern cells, where each mold pattern cell corresponds to the shape of the package housing 310. With the leads 340 appropriately aligned within each mold pattern cell, molding compound is provided within the mold pattern cells and cured. The cavity 320 of the package housing 310 may be created during the molding process, or may be created thereafter. According to an embodiment, the cavity 320 is defined by a cavity bottom surface 322, one or more bonding shelves 324, a lid attach surface 326, lower sidewalls 328 extending between the cavity bottom surface 322 and the bonding shelves 324, intermediate sidewalls 330 extending between the bonding shelves 324 and the lid attach surface 326, and upper sidewalls 332 extending between the lid attach surface 326 and the package top surface 312.

Figure 5:
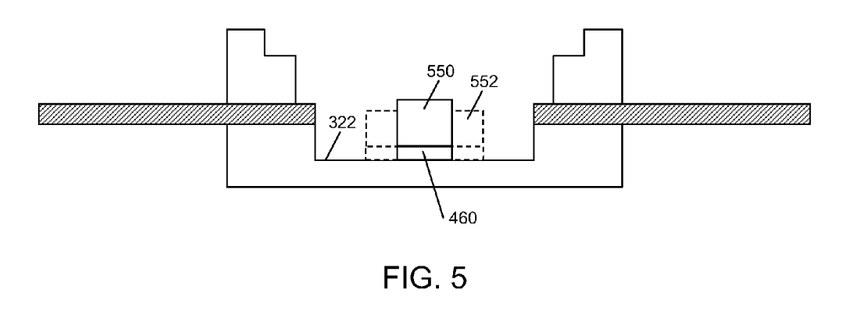

Various processes may then be performed to attach electronic circuits (e.g., electronic circuits 150, 152, FIG. 1) to the package housing 310 and to apply bubble restrictor material (e.g., bubble restrictor material 162, FIG. 1) to the cavity bottom surface 322. Embodiments of two of such processes are depicted in FIG. 2 in parallel branches (i.e., one branch/embodiment including blocks 204, 206, and another branch/embodiment including block 208). According to a first embodiment that begins in block 204, and referring to FIG. 4, die attach material 460 (e.g., die attach material 160, FIG. 1) is deposited on the bottom cavity surface 322 within one or more mounting areas of the cavity bottom surface 322. Referring to FIG. 5, one or more electronic circuits 550, 552 (e.g., electronic circuits 150, 152, FIG. 1) are then placed on the die attach material 460, resulting in the attachment of the electronic circuits 550, 552 to the cavity bottom surface 322 over the corresponding mounting area(s). In block 206, and referring to FIG. 6, bubble restrictor material 662 (e.g., bubble restrictor material 162, FIG. 1) is applied across all or substantially all of the non-mounting area of the cavity bottom surface 322. According to an embodiment, the die attach material 460 and the bubble restrictor material 662 cover an entirety of the cavity bottom surface 322. The die attach material 460 and the bubble restrictor material 662 may be substantially co-planar at their top surfaces, in an embodiment. According to alternate embodiments, the plane of the top surface of the die attach material 460 may be above or below the plane of the top surface of the bubble restrictor material 662. According to a further embodiment, additional bubble restrictor material 664 may be applied partially or completely up the lower sidewalls 328, as well, thus providing a mechanical restrictor of bubble formation on the lower sidewalls 328.

Figure 8:
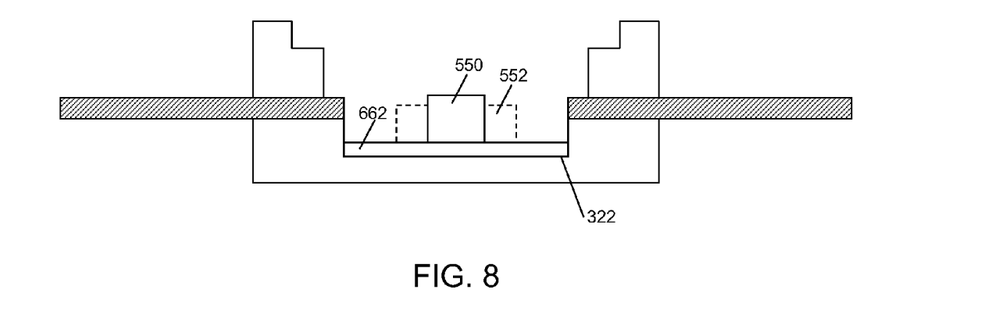

The embodiment depicted and described in conjunction with blocks 204, 206 and FIGS. 3-6 correspond to a multi-step process of attaching the electronic circuits 550, 552 and applying the bubble restrictor material 664. In such an embodiment, the die attach material 460 and the bubble restrictor material 664 may be the same or different materials. In an alternate embodiment that begins in block 208, and referring also to FIG. 7, a single layer of bubble restrictor material 662 may function as both the die attach material within the mounting area and the bubble restrictor material in the non-mounting area. More particularly, bubble restrictor material 662 may be applied in a single material deposition process, during which all or substantially all of the mounting area and the non-mounting area are covered with the bubble restrictor material 662. According to a further embodiment, additional bubble restrictor material 664 may be applied partially or completely up the lower sidewalls 328, as well. The additional bubble restrictor material 664 is not shown in the remaining Figures. Referring to FIG. 8, the one or more electronic circuits 550, 552 are subsequently placed on the bubble restrictor material 662, resulting in the attachment of the electronic circuits 550, 552 to the cavity bottom surface 322 over the corresponding mounting area(s) (i.e., the bubble restrictor material 662 also functions as a die attach material).

Referring again to FIG. 2, bondwires and/or other connectors are attached between the electronic circuits 550, 552 and the leads 340 in block 210. For example, referring also to FIG. 9, which illustrates a top view of the device, a plurality of bondwires 970, 972 (e.g., bondwires 170, 172, FIG. 1) are connected between the electronic circuits 550, 552 and portions of the leads 340 that are exposed within the cavity 320 at the bonding area (e.g., portions 144, FIG. 1). For example, bondwires 970 may be connected between a first electronic circuit 550 (e.g., a sensor circuit) and a second electronic circuit 552 (e.g., a control IC), and bondwires 972 may be connected between the second electronic circuit 552 and the leads 340 (e.g., between the control IC and the leads 340). Although FIG. 9 depicts a device that includes eight leads 340 extending from two sides of the device, alternate embodiments of a device may include more or fewer leads extending from more or fewer sides of the device.

Figure 9:
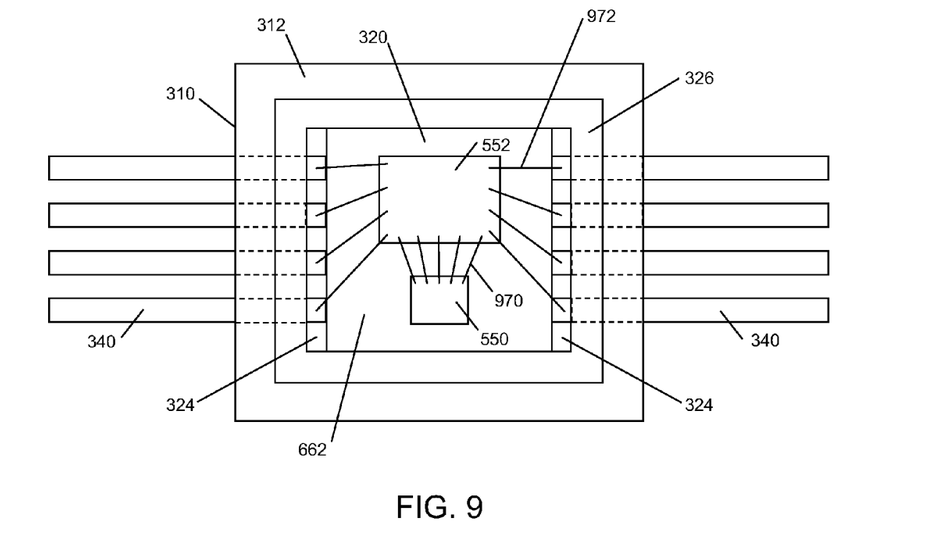

As the top view of FIG. 9 shows, the lid attach shelf 326 extends around the entire perimeter of the cavity 320, in an embodiment. In contrast, the bonding shelves 324 (and corresponding exposed portions of leads 340 within cavity 320) may be provided along fewer than all sides of the cavity 320. For example, in the embodiment depicted in FIG. 9, bonding shelves 324 and cavity-exposed portions of leads 340 are provided along only two sides of the cavity 320. In alternate embodiments, bonding shelves and leads may be provided along fewer (i.e., one) or more (e.g., three or four) sides of the cavity 320 and device.

Figure 10:
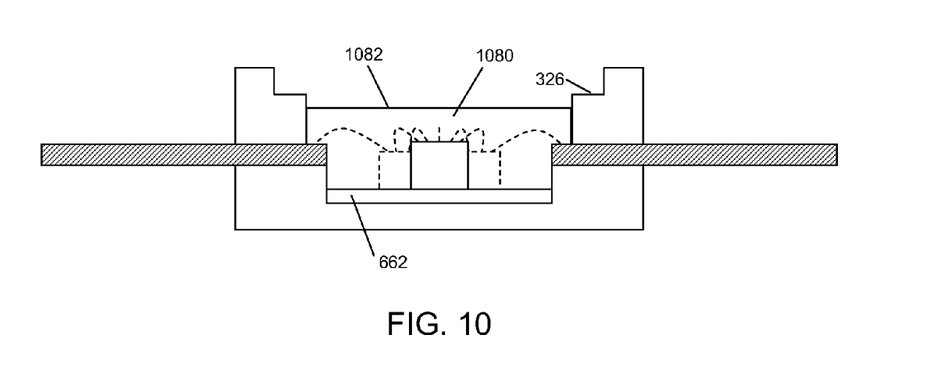

In block 212, and referring to FIG. 10, an overlying material 1080 (e.g., overlying material 180) is deposited over the bubble restrictor material 662. In addition, in an embodiment, the overlying material 1080 completely covers the bubble restrictor material 662, and encompasses the electronic circuits 550, 552 and the bondwires 970, 972. According to an embodiment, the overlying material 1080 has a top surface 1082 positioned below the lid attach surface 326.

Figure 11:
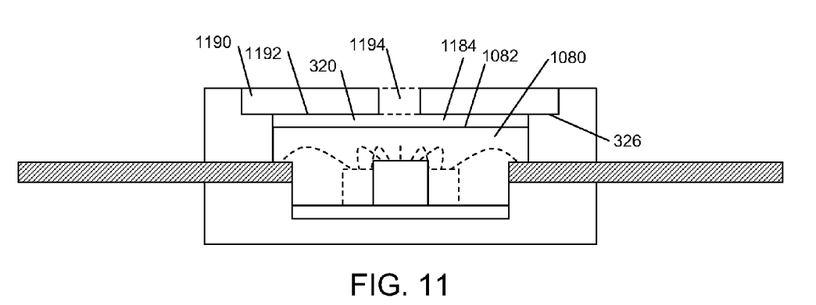
Figure 12:
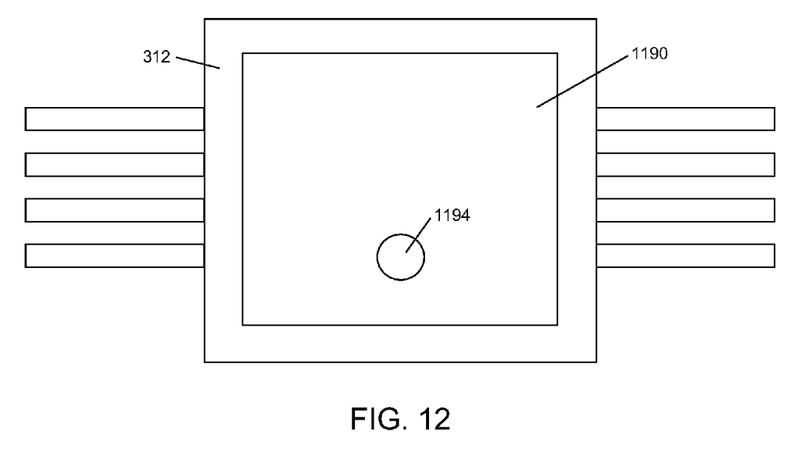

In block 214, and referring to FIGS. 11 and 12 (showing cross sectional and top views, respectively), a lid 1190 (e.g., lid 190, FIG. 1) is attached to the lid attach surface 326. According to an embodiment, the lid 1190 includes an opening 1194, which allows for exposure of the cavity 320 (or more particularly the top surface 1082 of the overlying material 1080) to an exterior of the device. An air gap 1184 (e.g., air gap 184, FIG. 1) is present between the top surface 1082 of the overlying material 1080 and a bottom surface 1192 of the lid 1190.

Figure 13:
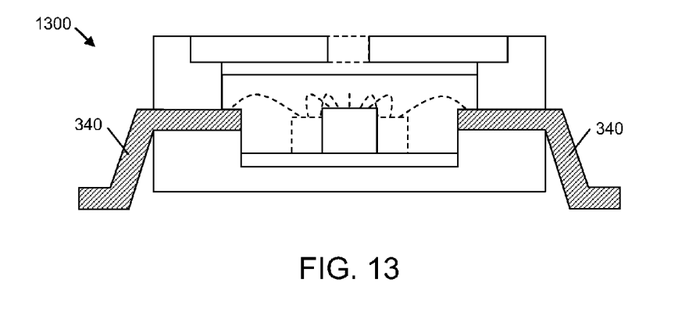

In block 216, and referring to FIG. 13, the device 1300 may be singulated by removing sacrificial features of a leadframe to which leads 340 are coupled, in an embodiment. In order to complete the manufacture process, the leads 340 thereafter may be bent or otherwise configured for attachment of the device 1300 to an external circuit board or other substrate (not illustrated).

Embodiments of electronic devices and manufacturing methods have been described above. An embodiment of a device includes a package housing, at least one electronic circuit, a first material, and a second material. The package housing includes a cavity that is partially defined by a cavity bottom surface, and the cavity bottom surface includes a mounting area and a non-mounting area. The at least one electronic circuit is attached to the cavity bottom surface over the mounting area. The first material has a relatively high, first modulus of elasticity, and covers the non-mounting area. The second material has a relatively low, second modulus of elasticity, and is disposed over the first material within the cavity. According to a further embodiment, the first modulus of elasticity is sufficiently high so that the first material functions as a restrictor of bubble formation at an interface between the first material and the non-mounting area of the cavity bottom surface. According to another further embodiment, the at least one electronic circuit includes a first electronic circuit configured to produce sensor signals indicating a sensed characteristic of an external environment, where the first electronic circuit is selected from a pressure sensor, an accelerometer, and a transducer.

Another embodiment of a device includes a package housing, a sensor circuit, a first material, and a second material. The package housing includes a cavity that is partially defined by a cavity bottom surface. The cavity bottom surface includes a mounting area and a non-mounting area. The sensor circuit is attached to the cavity bottom surface over the mounting area. The first material has a first modulus of elasticity, and covers the non-mounting area. The second material has a second modulus of elasticity, and is disposed over the sensor circuit and over the first material. The first modulus of elasticity is higher than the second modulus of elasticity.

Another embodiment includes a method for manufacturing an electronic device that includes a package housing with a cavity that is partially defined by a cavity bottom surface, where the cavity bottom surface includes a mounting area and a non-mounting area. The method includes applying a first material on the mounting area of the cavity bottom surface, placing at least one electronic circuit on the first material to attach the at least one electronic circuit to the package housing over the mounting area, covering the non-mounting area with a second material having a first modulus of elasticity, and disposing a third material over the second material. The third material has a second modulus of elasticity that is lower than the first modulus of elasticity.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
   a package housing with a cavity, wherein the cavity is partially defined by a cavity bottom surface, a bonding shelf above the cavity bottom surface, and a lower cavity sidewall extending between the cavity bottom surface and the bonding shelf, wherein the cavity bottom surface includes a mounting area and a non-mounting area;
   at least one electronic circuit attached to the cavity bottom surface over the mounting area;
   a plurality of conductive structures, each having first and second portions that are electrically coupled, wherein each first portion is accessible within the cavity over the bonding shelf, and each second portion is exposed to an exterior of the package housing;
   a plurality of connectors coupled between the at least one electronic circuit and the first portions of the plurality of conductive structures;
   a first material having a relatively high, first modulus of elasticity in direct contact with and covering the non-mounting area, the mounting area, and at least a portion of the lower cavity sidewall, and also in direct contact with the at least one electronic circuit, wherein the first material is a die attach material that attaches the at least one electronic circuit to the mounting area and extends to the lower cavity sidewall; and
   a second material having a relatively low, second modulus of elasticity disposed over the first material within the cavity.

2. The device of claim 1, wherein the first modulus of elasticity is sufficiently high so that the first material functions as a restrictor of bubble formation at an interface between the first material and the non-mounting area of the cavity bottom surface.

3. The device of claim 1, wherein the first material is a single layer of material having a planar top surface, and wherein the at least one electronic circuit is coupled to the planar top surface of the single layer.

4. The device of claim 1, wherein the first material is a polymer adhesive, and the second material is an elastomer gel.

5. The device of claim 1, wherein the at least one electronic circuit includes a first electronic circuit configured to produce sensor signals indicating a sensed characteristic of an external environment, and the first electronic circuit is selected from a pressure sensor, an accelerometer, and a transducer.

6. The device of claim 5, wherein the at least one electronic circuit further includes a second electronic circuit attached to the cavity bottom surface and electrically coupled to the first electronic circuit, wherein the second electronic circuit is configured to provide control signals to the first electronic circuit, receive the sensor signals from the first electronic circuit, and send signals representative of the sensor signals to external circuitry.

7. A device comprising:
   a package housing with a cavity, wherein the cavity is partially defined by a cavity bottom surface, a bonding shelf above the cavity bottom surface, and a lower cavity sidewall extending between the cavity bottom surface and the bonding shelf, wherein the cavity bottom surface includes a mounting area and a non-mounting area;

at least one electronic circuit directly attached to the cavity bottom surface over the mounting area with a die attach material;

a plurality of conductive structures, each having first and second portions that are electrically coupled, wherein each first portion is accessible within the cavity over the bonding shelf, and each second portion is exposed to an exterior of the package housing;

a plurality of connectors coupled between the at least one electronic circuit and the first portions of the plurality of conductive structures;

a first material having a relatively high, first modulus of elasticity covering the non-mounting area, wherein the first material is different from the die attach material, and the first material extends from the mounting area to the lower cavity sidewall;

a second material having a relatively low, second modulus of elasticity disposed over the first material within the cavity; and a lid coupled to the package housing over the cavity, wherein an air gap is present within the cavity between the lid and the second material, and the lid includes an opening between top and bottom surfaces of the lid.

8. The device of claim 7, wherein the cavity is further defined by:

a bonding area above the cavity bottom surface and below a top of the cavity, wherein the first portions of the plurality of conductive structures are accessible within the cavity at the bonding area; and wherein the cavity sidewall extends between the cavity bottom surface and the bonding area, wherein the first material covers at least a portion of the cavity sidewall.

9. A method for manufacturing an electronic device, the method comprising the steps of:

providing a package housing with a cavity, wherein the cavity is partially defined by a cavity bottom surface, a bonding shelf above the cavity bottom surface, and a lower cavity sidewall extending between the cavity bottom surface and the bonding shelf, wherein the cavity bottom surface includes a mounting area and a non-mounting area;

coupling a plurality of conductive structures to the bonding shelf, each having first and second portions that are electrically coupled, wherein each first portion is accessible within the cavity over the bonding shelf, and each second portion is exposed to an exterior of the package housing;

applying a first material directly on both the mounting area and the non-mounting area of the cavity bottom surface, wherein the first material extends to the lower cavity sidewall, the first material has a first modulus of elasticity, and the first material is a die attach material;

placing at least one electronic circuit directly on the first material to attach the at least one electronic circuit to the package housing over the mounting area;

coupling a plurality of connectors between the at least one electronic circuit and the first portions of the plurality of conductive structures; and disposing a second material over the first material, wherein the second material has a second modulus of elasticity that is lower than the first modulus of elasticity.

10. The method of claim 9, further comprising:

coupling a lid to the package housing over the cavity, wherein an air gap is present within the cavity between the lid and the second material, and the lid includes an opening between top and bottom surfaces of the lid.

* * * * *